US 6,655,856 B2

(12) United States Patent
Nakanishi et al.

(10) Patent No.: US 6,655,856 B2
(45) Date of Patent: Dec. 2, 2003

(54) OPTICAL MODULE

(75) Inventors: Hiromi Nakanishi, Osaka (JP); Takeshi Okada, Osaka (JP); Yoshiki Kuhara, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 156 days.

(21) Appl. No.: 09/812,693

(22) Filed: Mar. 21, 2001

(65) Prior Publication Data

US 2001/0024553 A1 Sep. 27, 2001

(30) Foreign Application Priority Data

Mar. 22, 2000 (JP) ............................. 2000-079596

(51) Int. Cl.[7] .............................. G02B 6/42; G02B 6/36
(52) U.S. Cl. ............................. 385/94; 385/80; 385/89; 385/92
(58) Field of Search ........................... 385/94, 88, 89, 385/90, 80, 92, 93

(56) References Cited

U.S. PATENT DOCUMENTS

| 5,210,800 A | * | 5/1993 | Asai et al. ............... 385/12 |
| 5,940,550 A | * | 8/1999 | Plickert et al. ........... 385/15 |
| 6,075,911 A | * | 6/2000 | Goto ....................... 385/31 |
| 6,170,996 B1 | * | 1/2001 | Miura et al. .............. 385/94 |
| 6,201,704 B1 | * | 3/2001 | Poplawski et al. ......... 361/753 |
| 6,257,773 B1 | * | 7/2001 | Moriyama et al. .......... 385/92 |
| 6,318,908 B1 | * | 11/2001 | Nakanishi et al. ......... 385/89 |
| 6,422,766 B1 | * | 7/2002 | Althaus et al. ............ 385/94 |
| 6,457,877 B2 | * | 10/2002 | Kato et al. ................. 385/92 |

FOREIGN PATENT DOCUMENTS

JP  10-303508  11/1998

OTHER PUBLICATIONS

F. Ichikawa, et al., "Highly reliable plastic packaging for laser diodes and photodiodes modules," The Institute of Electronics, Information and Communication Engineers Conference 1998, p. 327. (Japanese version attached to translation).

* cited by examiner

*Primary Examiner*—Edward J. Glick
*Assistant Examiner*—Krystyna Suchecki
(74) *Attorney, Agent, or Firm*—Smith, Gambrell & Russell, LLP

(57) ABSTRACT

The object is to provide an optical module for optical transmission which has a double resin structure wherein a transparent resin and a fixing resin are combined, which is low in price, and is easily produced. A package with a inside-and-outside double structure comprising an inner container having barriers filled with a transparent resin and a hard outer container formed of a fixing resin. The inner container stores the highly fluid transparent resin and prevents it from flowing out. The outer container provides mechanical strength and airtightness.

11 Claims, 8 Drawing Sheets

OPTICAL MODULE

BACKGROUND OF THE INVENTION

1. Field of the Invention

The present invention relates to an optical module used for optical communications, for example, an optical module such as an optical transmitter, an optical receiver, an optical demultiplexer, or an optical multiplexer. In particular, it relates to the improvement of a package structure and a portion where optical fibers are fixed.

2. Description of the Related Art

In a prior-art optical module, optical coupling between an optical fiber and an optical device such as a photo diode (PD) and a laser diode (LD) was often achieved via a free space by using a lens. Such a lens is used for focusing light. When the light exits once in the free space, it is effective to provide the lens. Also, since the coupling is made via a free space, problems such as the difference in thermal expansion coefficient between the optical fiber and element, stress, and distortion do not occur. A prior-art example will be described with reference to the optical transmitter and the receiver.

FIG. 1 is a longitudinal section showing an example of the transmitter which is most commonly adopted for practical use. An outer fence comprises a metallic circular stem 1, a cylindrical metallic lens holder 2, and a metallic conic ferrule holder 3. The housing has a shape with an axial-symmetric three-dimensional expanse. A pole 4 is provided on the upper surface of the stem 1 and on the side thereof, an LD 5 is fixed. The LD has its end faces directed in the vertical direction so that light is emitted in the axial direction. An upper surface-illuminated type monitor PD 6 is fixed on the central part of the stem 1. A cylindrical cap 7 is attached so that the LD 5 and the PD 6 are surrounded. Furthermore, a lens holder 2 is fixed so that the cap is surrounded. A lens 8 is positioned directly above the LD 5.

A tubular ferrule 9 grasps the tip end of an optical fiber 10. The ferrule 9 is inserted in a hole on the top portion of the ferrule holder 3. The axis of the optical fiber 10 exists on the center line of a metallic package (the stem 1, lens holder 2, and ferrule holder 3). That is, the center of the stem 1, the PD 6, the LD 5, the lens 8, and the optical fiber 10 are lined on the center line. The lens holder 2 and the ferrule holder 3 each having a three-dimensional structure are aligned with respect to the x-y surface and the ferrule 9 is aligned in the z direction, and they are then fixed. Herein, lead pins 11 are terminal ends to connect to an external electric circuit.

This is an example of an LD module, however, a PD module having a similar three-dimensional structure is also used. Herein, illustration thereof is omitted. In either three-dimensional structure, a beam of light is perpendicular to the stem surface and the optical fiber protrudes from the top portion of the package. The ray of light exits from the optical fiber to the free space and enters the optical element, or it exits from the optical element and enters the optical fiber via the free space.

The module having such a three-dimensional structure covered by the metal package is advantageous in that it can shut out external noise, has a long life without being affected by moisture and oxygen in the open air, and also has high reliability.

The present structures of the LD module shown in FIG. 1 and the PD module are excellent. However, there is a considerable number of components, alignment thereof takes much time and labor, and the production cost is high.

In addition, they have the drawback of having a large shape. The shape and structure without change has limited cost reduction.

Therefore, in order to achieve further reduction in cost and size, active research and development has been devoted to modules of a surface-mount type, etc. A structure of a module wherein an optical fiber is fixed parallel to a bench surface so that a beam of light is parallel with a substrate surface (package surface) is generally referred to as the surface-mount type. In the surface-mount type, various types are included. In some of the types, a free space (air, vacuum) is provided between an optical fiber and an optical device, and in other types, the space between an optical fiber and an optical device is covered by a resin. The present invention relates to a module wherein the section between the optical fiber and devices is covered by a resin. The object of the present invention is to provide a module that the section between the optical fiber and devices is covered by a resin. Now, a prior art wherein such a section is covered by a resin will be described.

For example, a structure as in FIG. 2 has been studied. A horizontal Si substrate 12 is mounted on a horizontal package terrace 13. A Planar Lightwave Circuit (PLC) layer 14 is formed on the Si substrate 12. This comprises an $SiO_2$ layer formed thereon by oxidizing the Si substrate or an $SiO_2$ layer by sputtering. In fact, by doping Ge, etc. on a part of the $SiO_2$ layer, a part with a high refractive index is linearly formed and it serves as a light guide (waveguide). On the Si substrate 12, an LD 15 is fixed on an extension of the waveguide (axis). And immediately behind thereof, a PD 16 for monitoring is mounted. This serves to monitor LD power and to maintain the LD power stably.

A fixing portion 17 is provided at the front end of the waveguide, and in a hole 18 thereof, the tip end of an optical fiber 19 is inserted and fixed. The optical fiber 19, the waveguide, the LD 15, and the PD 16 are lined up straight on the substrate surface. Light which is emitted from the LD propagates in parallel with the surface of the substrate. Therefore, the structure is referred to as the surface-mount type. A transparent silicone resin 21 covers the terminal end 20 of the waveguide, the LD 15, and the PD 16. The light which is emitted forward from the LD 15 propagates through the transparent resin 21 and enters the waveguide terminal end 20. The light which is emitted rearward from LD 15 propagates through the transparent resin 21 and enters the PD 16. The light from the LD propagates only through the resin without going out to the free space. Naturally, the resin must be transparent since the light passes therethrough.

However, since the transparent resin 21 lacks moisture resistance and stress resistance, the outside thereof is covered by a black epoxy resin 22. Since the epoxy resin becomes a hard and solid coating when being hardened, the epoxy resin is excellent in airtightness, mechanical strength, and moisture resistance, etc. Thus, by double-sealing the PD and LD by means of two types of resins with different properties, necessary characteristics such as moisture resistance, stress resistance, and strength are realized, while allowing light to pass therethrough.

The prior-art example of FIG. 2 has been suggested, for example, in ① "Highly reliable resin-sealed LD-PD module" by Fumio Ichikawa, Mitsuo Fukuda, Yasufumi Yamada, Kuniharu Kato, Koji Sato, and Hiroshi Toba, in the General Convention of the Electronic Society of 1998, C-3-161, p.327.

A silicone resin which is transparent and flexible is used for portions through which light needs to pass such as the PD, LD, and the end of the waveguide. The outside thereof is covered by a strong epoxy resin, whereby environment resistance is enhanced. There are a fewer number of components. Because of the sealing means of the resins, the module is lower in price than a metal package. Because of the surface-mount type, the time and labor for alignment is unnecessary. Since the structure does not have a three-dimensional structure but has a two dimensional structure, a smaller size can be achieved.

While such an element as described above has been newly suggested, it has not yet reached the stage for practical use. If a simple module structure becomes possible, a small and low-price optical module can be provided, so that optical communication may spread widely to ordinary homes. This suggestion is promising.

This structure is characterized by double-sealing by means of resins. An inside transmittance (transparent resin) and an outside opaque resin are complementarily utilized. A transparent resin is used on the inside in order to suppress the reflection of light on the boundary between the waveguide and space. For example, a silicone-based resin is used. The transparent resin not only transmits light but also reduces reflection on the end face, whereby the light is suppressed from spreading.

There are not only such optical advantages but also mechanical advantages. The inside transparent resin does not harden into a solid but is in a gel form and is flexible, that is, a soft resin. Since the resin covers the LD and PD, it also serves to protect these semiconductor chips from the outside area. The transparent resin has flexibility and also has an effect to protect a wire for conduction. If the wire is covered over by a hard resin, the wire can be broken due to shocks, etc., however, since the wire is covered by the flexible resin, it is prevented from being cut.

Since the transparent resin itself is soft, it does not cause damage or distortion to the chips and the optical fiber. Such a characteristic of softness is advantageous in the mechanical aspect.

However, from the viewpoint of reliability that is required in the module, the transparent silicone resin has drawbacks. It has high permeability and lacks moisture resistance. The fact that it is flexible means, on the other hand, that a fixed shape cannot be obtained.

Therefore, such a resin as this is entirely covered by an epoxy-based resin in order to fix the shape and improve the moisture resistance. The epoxy-based resin is excellent in hardening ability and fixes its shape. It is excellent in shapeability. It is also excellent in moisture resistance and high in reliability. In addition, the epoxy-based resin does not have transmittance and is suitable to prevent light from entering from the outside area. Such a double sealing resin structure as ① has the abovedescribed advantages.

However, in fact, this double sealing structure has some disadvantages. First, a silicone-based resin is coated on the end of a waveguide and narrow portions between the LD and PD, then is hardened by means of heat and ultraviolet ray, etc. It is preferable if the resin forms a round shape due to surface tension and stops in a condition where about only the area of the PD, LD, and the end of the waveguide are covered. However, in fact, it is hardly possible. This resin is high in fluidity and it does not easily stick to and fit to the substrate. Therefore, the resin slips and flows about the horizontal surface of the substrate. There is a case where the silicon-based resin does not stay at a fixed point and flows due to vibration, inclination, the direction where the resin drops, and instability in supplying pressure. There is also a case where it flows excessively, coats widely, and solidifies on the substrate.

Since the resin is used to enhance smoothness, even if an epoxy resin is coated thereon, the epoxy resin is repelled and flows. That is, an excessive amount of silicone-based resin hinders adhesion of the epoxy resin. If the substrate surface is exposed, the epoxy resin can be adhered, however, if the substrate surface is broadly covered by the silicone based resin, the epoxy resin does not fit. Then, since it cannot be closely fitted to the substrate, the resin comes off. In addition, if it broadens to a lead frame, it covers the upper surface of the lead frame. In this case, wire bonding becomes impossible, and wiring cannot be performed.

Such excessive fluidity, detachability, and lubricity of the silicone-based resin cause a problem. This is the most serious drawback. In addition, there are other weak points. There is also a possibility that stress is applied on the silicone resin as the base resin when it is covered by epoxy and the wire is broken. Also, a gap may be produced in the optical path due to the pressure by the epoxy resin. When a black epoxy resin enters the gap, optical loss increases remarkably. There may be a case where a part of the optical element is exposed by being pushed by the epoxy resin.

The device of FIG. 2 has the resin-double covering structure, however, since there is nothing to restrict the silicone-based resin as the base to flow, the abovementioned disadvantages exist.

SUMMARY OF THE INVENTION

A first object of the present invention is to provide a package structure wherein fluidity of a silicone resin as the base is restricted so that a silicone-based resin does not widely cover a substrate. A second object of the present invention is to provide a package structure wherein a silicone-based resin is prevented from flowing into an unnecessary part, whereby a strong covering of an epoxy resin becomes possible.

A package structure of a module of the present invention comprises an inner barrier structure to store a soft silicone-based resin in a gel form and an outer shell structure composed of a fixing resin which surrounds the outside of the inner barrier structure. That is, an inner container for a silicone-based resin is provided inside the package. Therefore, a container having an inside-and-outside double structure is provided comprising the inner container having the barrier inside thereof and the outer container. The inner container and outer container can be formed of the same package material. Otherwise, the outer fence portion on the outside may be formed not of the package material but by hardening an epoxy resin. An optical fiber end and optical devices such as an LD, and a PD, etc. are provided in the inner container and they are filled with a silicone-based resin. Thereon, an epoxy resin is poured to fill the outer container of the package and solidified. The package has the double structure as well as the resins do.

A transparent silicone-based resin is filled inside the inner container. This base resin completely covers the optical devices and optical fiber end. It also covers the wire. However, since the inner container is surrounded by walls, the resin having fluidity does not overflow. The resin does not flow freely on the substrate. The resin does not moisten broadly on the substrate to hinder the epoxy resin from fitting. The effect of the barriers of the inner container is the most advantageous in terms of holding the transparent resin (inner resin) without being spilled.

As shown in and after FIG. 3, the inner resin (transparent resin, silicone-based) 35 is transparent and guides light to the section between optical fibers or between an optical fiber and an optical element. The refractive index of the resin is almost the same as that of the optical fiber so that reflection on the end face is minimal and the light does not spread. The inner resin also acts to protect the wire from being applied with a stress.

The outer resin (fixation resin such as an epoxy) 36 hardens, whereby it protects the inner structure. Since the outer resin does not serve to guide light, it can be black. It also has an airtight-sealing function to prevent water from entering by trickling down a lead frame.

The present invention provides a package having a structure of a plane-mount type and an inside-and-outside double structure comprising an inner container having a barrier and a hard outer container, wherein a glue that is high in fluidity can be stored in the inner container. The range where a silicone-based resin spreads can be limited in the production process with accuracy. The inner container is especially novel and it brings about a benefit in the production process. The outer container provides mechanical strength and airtightness. When a silicone-based transparent resin sticks to a package surface, it repels an epoxy resin and reduces the adhesion, however, the silicone-based resin does not flow out in the present invention. Therefore, a fixing resin of the epoxy base, etc. can form a firm outer shell portion at all times.

The present invention provides a double resin structure comprising flexible and rigid resins which is skillfully combined and it has a complementary effect. Since the inside is made of a transparent resin, light transmission between an optical fiber and an optical element are not spoiled. Since the resin is in a gel form, it reduces stress, the stress is not applied on the optical element, and a wire is prevented from being cut. These are the effects of a completed transparent resin product. Furthermore, since a hard resin is used on the outside, the strength for fixing an optical fiber is high. The structure is airtight and has excellent moisture resistance. The circumference of the lead frame can be fixed by the epoxy resin, whereby the strength and moisture resistance can be improved. Also, since the package structure is made of the resins, mass production is possible and the optical devices and optical fiber can easily be mounted at low cost. According to the present invention, reduction in cost and size of a wide range of optical modules can stably be realized.

Thus, the spread of optical transmission to each home is more actively enhanced.

DETAILED DESCRIPTION OF THE INVENTION

The present invention is characterized by comprising the inner container which has a plurality of sidewalls (barriers) and stores the transparent resin, and contains optical components and the outer container fixed to the outside of the inner container by the fixing resin. Apart from the above characteristics, various forms can be considered. It is more preferable if the sidewalls are provided on all sides, however the sidewalls provided on only two sides in the direction of the lead frame are satisfactory. Even by only the two barriers, the silicone resin can be prevented from sticking to the lead frame.

Figure 10:
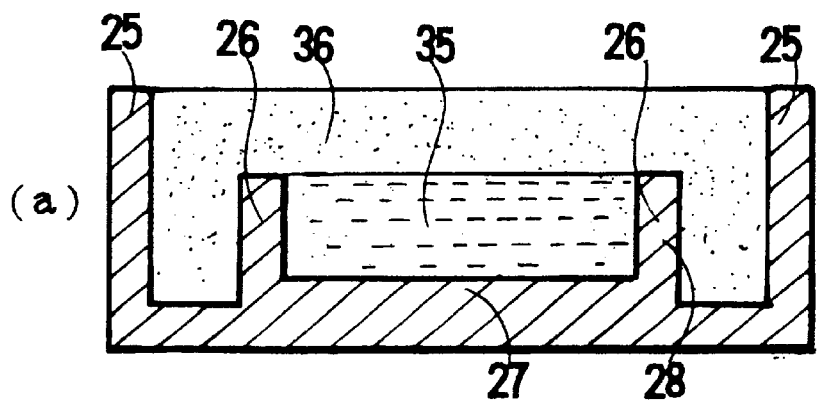
FIG. 10 is a longitudinal section showing an embodiment of the inside-and-outside double container according to the present invention, wherein the bottom plates are identical, sidewalls are provided, and the upper portion is opened.
Figure 11:
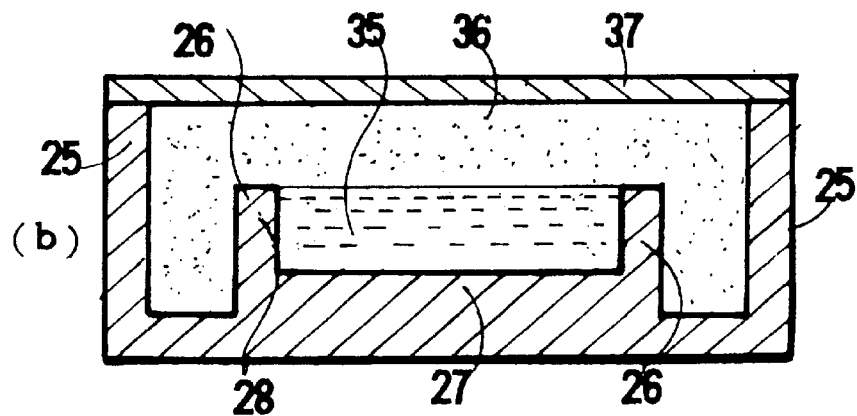
FIG. 11 is a longitudinal section showing an embodiment, according to the present invention, of the inside-and-outside double container in which the bottom plates are identical, sidewalls are provided, and the upper portion is opened, wherein a lid is provided on the outer container.
Figure 12:
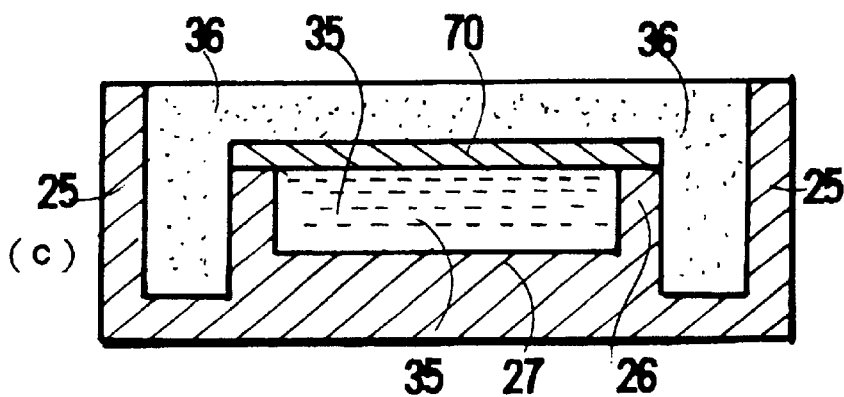
FIG. 12 is a longitudinal section showing an embodiment, according to the present invention, of the inside-and-outside double container in which the bottom plates are identical, sidewalls are provided, and the upper portion is opened, wherein a lid is provided on the inner container.
Figure 13:
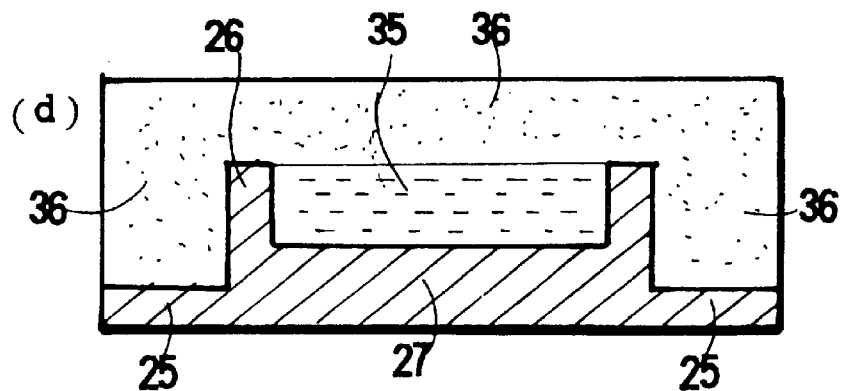
FIG. 13 is a longitudinal section showing an embodiment, according to the present invention, of the inside-and-outside double container in which the bottom plates are identical, the inner container has sidewalls, and the upper portion is opened, wherein the outer container has no sidewall and has an outer shell portion by hardening of a resin itself.
Figure 14:
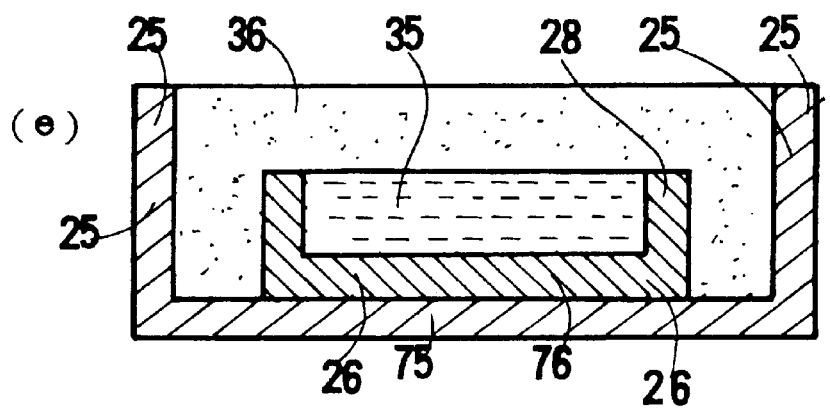
FIG. 14 is a longitudinal section showing an embodiment, according to the present invention, of the double container composed of separate inside and outside containers in which the bottom plates are different, sidewalls are provided, and the upper portions are opened, wherein the bottom portion of the inner container is adhered to the bottom portion of the outer container.
Figure 15:
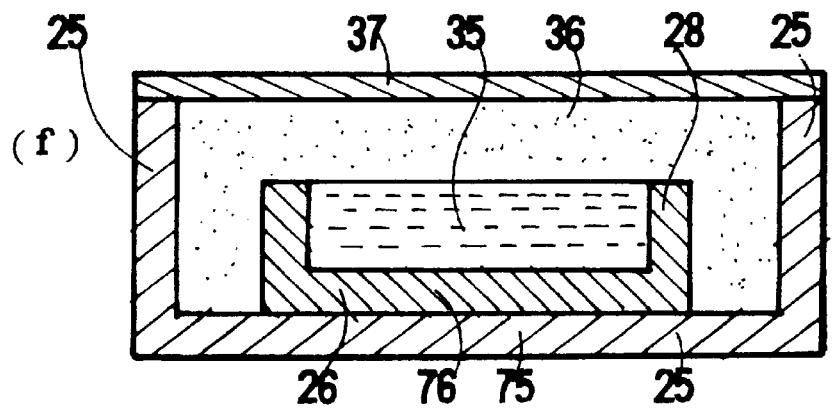
FIG. 15 is a longitudinal section showing an embodiment, according to the present invention, of the double container composed of separate inside and outside containers in which the bottom plates are different, sidewalls are provided, and the upper portion is opened, wherein the bottom portion of the inner container is stuck to the bottom portion of the outer container and a lid is provided on the outer container.
Figure 16:
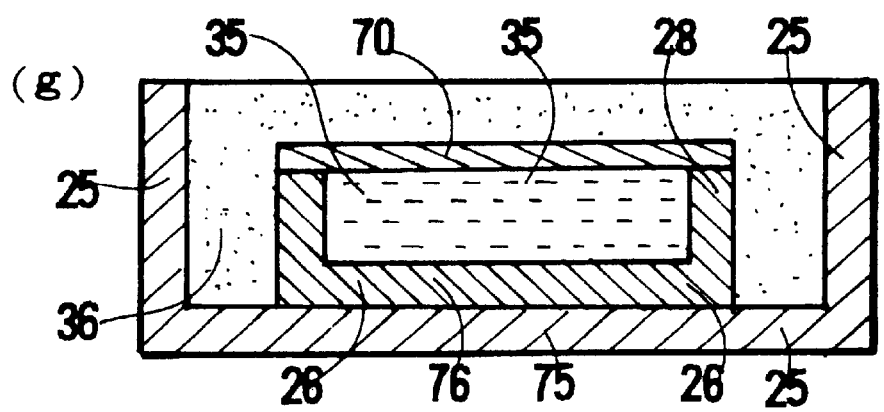
FIG. 16 is a longitudinal section showing an embodiment, according to the present invention, of the double container composed of separate inside and outside containers in which the bottom plates are different, sidewalls are provided, and the upper portion is opened, wherein the bottom portion of the inner container is adhered to the bottom portion of the outer container and a lid is provided on the inner container.
Figure 17:
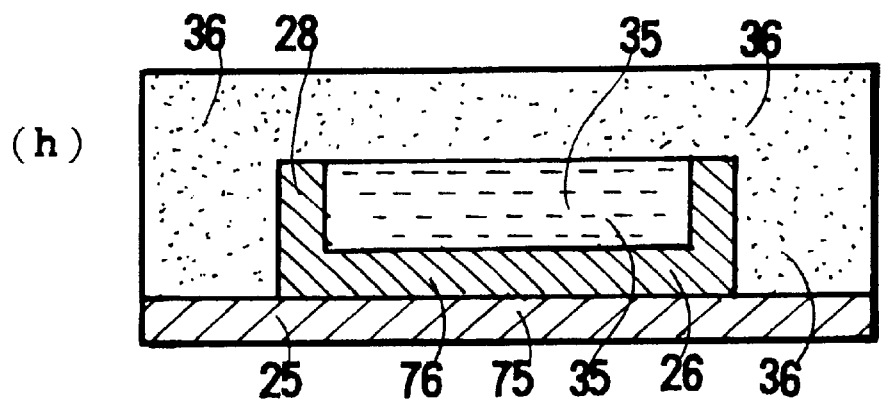
FIG. 17 is a longitudinal section showing an embodiment, according to the present invention, of the inside-and-outside double container in which the bottom plates are different, the inner container has sidewalls, and the upper portion is opened, wherein the outer container has no sidewall, the bottom portion of the inner container is stuck to the bottom portion of the outer container, and the outer container has an outer shell portion by hardening a resin itself.

The difference in forms are shown in FIG. 10 to FIG. 17.
(a) An inside-and-outside double container, wherein the bottom plates are identical, sidewalls are provided, and the upper portion is opened (FIG. 10).
(b) An inside-and-outside double container in which the bottom plates are identical, sidewalls are provided, and the upper portion is opened, wherein a lid 70 is provided on the outer container (FIG. 11).
(c) An inside-and-outside double container in which the bottom plates are identical, sidewalls are provided, and the upper portion is opened, wherein a lid is provided on the inner container (FIG. 12).
(d) An inside-and-outside double container in which the bottom plates are identical, the inner container has sidewalls, and the upper portion is opened, wherein the outer container has no sidewall. The outer container has an outer shell portion by hardening of a resin itself (FIG. 13).
(e) A double container composed of separate inside and outside containers in which the bottom plates are different, sidewalls are provided, and the upper portions are opened, wherein the bottom portion of the inner container is adhered to the bottom portion of the outer container (FIG. 14).
(f) A double container composed of separate inside and outside containers in which the bottom plates are different, sidewalls are provided, and the upper portion is opened, wherein the bottom portion of the inner container is to the bottom portion of the outer container. A lid is provided on the outer container (FIG. 15).
(g) A double container composed of separate inside and outside containers in which the bottom plates are different, sidewalls are provided, and the upper portion is opened, wherein the bottom portion of the inner container is adhered to the bottom portion of the outer container. A lid is provided on the inner container (FIG. 16).
(h) An inside-and-outside double container in which the bottom plates are different, the inner container has sidewalls, and the upper portion is opened, wherein the outer container has no sidewall. The bottom portion of the outer container is stuck to the bottom portion of the outer container. The outer container has an outer shell portion by hardening of a resin itself (FIG. 17).

Although other forms can be considered, exemplification is not given here. The sidewalls of any type of the inner container are wall surfaces on two parallel sides or on three sides, or, preferably, on four sides (rectangular) and the heights are approximately the same. In any case, an inner container 26 is provided in the outer container 25 and when the plates of the bottom surfaces (bottom wall) of the inner and outer containers are common, the plates are described as a bottom plate 27. The inside of the inner container 26 is filled with a transparent resin 35. A fixing resin 36 seals the transparent resin 35 and fills the outer container 25. If the inner container and outer container are separately provided, the bottom plate 76 of the inner container and the bottom plate 75 of the outer container are glued.

The above description is made according to a categorization based on a form in which the package has the inside-and-outside double structure. Components for exchanging signal light such as an optical fiber, optical devices, and an optical waveguide, etc. are accommodated in the inner container. In respect of the above components, various combinations can be considered according to the sort, number, type, and purpose of the components. A medium for exchanging optical signals between the outside and an optical device is an optical fiber, however, there may be a case wherein an optical device is directly connected to the outside equipment. There also may be a case of connection via an optical waveguide. There may be a case of connection between the optical fiber and the LD, connection between the optical fiber and the PD, connection between the optical fiber and the PD and LD, or connection between an optical fiber and an optical fiber.

A variety of modes will be described from the standpoint of combination of the optical elements.
(1) Optical fiber+LD:
An LD is fixed on the substrate and an optical fiber is attached hereto. This is an optical transmitter.
(2) Optical fiber+LD+PD:
An LD and monitoring PD are fixed on the substrate and an optical fiber is attached hereto. This is an optical transmitter, as well.
(3) Optical fiber+PD:
A PD is fixed on the substrate and an optical fiber is attached hereto. This is an optical receiver.
(4) Optical fiber+PD+AMP:
A PD and AMP are fixed on the substrate and an optical fiber is attached hereto. A PD signal is amplified in the AMP. This is an optical receiver, as well.
(5) Optical fiber+optical waveguide+LD:
An LD is fixed on the substrate on which an optical waveguide is formed and an optical fiber is attached on the front end face of the substrate. This is an optical transmitter.
(6) Optical fiber+optical waveguide+LD+PD:
An LD and monitoring PD are fixed on the substrate on which optical waveguides are formed and an optical fiber is attached on the front end face of the substrate. This is an optical transmitter, as well.
(7) Optical fiber+optical waveguide+PD:
A PD is fixed on the substrate on which an optical waveguide is formed and an optical fiber is attached on the front end face of the substrate. This is an optical receiver.
(8) Optical fiber+optical waveguide+PD+AMP:
A PD and AMP are fixed on the substrate on which an optical waveguide is formed and an optical fiber is attached on the front end face of the substrate. A PD signal is amplified in the AMP. This is an optical receiver, as well.
(9) Optical fiber+optical waveguide+optical fiber:
Optical fibers are attached to the end faces of the substrate on which an optical waveguide is formed. If an optical fiber is attached to each end, a simple relay is produced. However, by providing a Y-branch in the optical waveguides and fixing optical fibers to the end face of the substrate that lead to both ends of the branch, an optical demultiplexer and an optical multiplexer can be produced.

EXAMPLES

Example 1

Optical Transmitter

Figure 3:
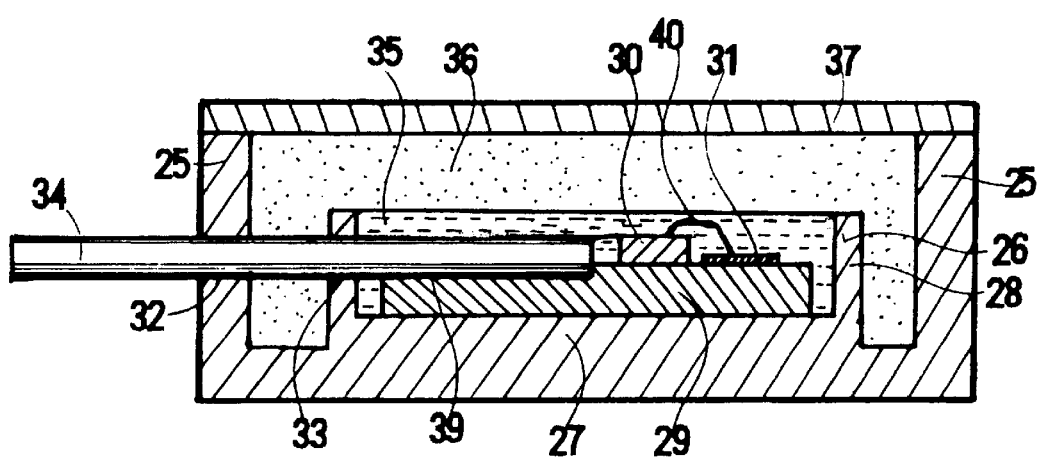
FIG. 3 is a longitudinal section showing Example 1 having a double barrier structure and double glue structure, wherein the present invention is applied to a transmitter.

Examples of the invention will be described with reference to the drawings. An example of the optical transmitter is shown in FIG. 3 (section) and FIG. 4 (plane view). The outer container 25 whose upper portion is opened and the inner container 26 which is formed inside the outer containers have the bottom plates 27 jointly. The inner container 26 has barriers 28 on all sides thereof. The barriers are provided so that a fluid can be held. The barriers of the inner container 26 are shorter than the sidewalls of the outer container 25. Since the containers have the bottom plates 27 jointly and the upper portions of both containers are opened, the container can be shaped from plastic, etc. They can be produced from, for example, a liquid crystal polymer. A substrate 29 is accommodated in the inner container 26. An LD 30 is fixed on the substrate 29. A wiring pattern 31 is printed in advance and an electrode of the LD 30 and the wiring pattern 31 are connected by means of a wire 40.

On the front end walls of the outer container 25 and inner container 26, horizontal holes 32 and 33 are bored. A shallow V-groove 39 is made on the substrate (Si bench) 29. An optical fiber 34 is inserted through the holes 32 and 33 and placed up to the middle of the substrate 29. The section between the wiring pattern 31 or the electrode of the LD 30 and the lead frame 38 is also connected by means of wire bonding.

A transparent resin 35 is filled in the inner container 26. The end of the optical fiber, the LD 30, the wiring pattern 31, the wire 40, and the substrate 29 are completely covered by the transparent resin 35. The upper area of the inner container 26 and the outside of the inner container 26 are filled with a fixing resin 36. This resin has no transmittance but has fixation characteristics. The fixing resin has shapeability. Further thereon, a top plate 37 is covered.

In this example, a package in which the barriers (inner container 26) and the outer fence (outer container 25) are integrated is mass-produced by means of a mold. As a material of the package, for example, the liquid crystal polymer as mentioned above is preferable since it can be shaped easily and can be metallized. By means of the mold, a large number of packages can be shaped in series at a stroke. A series of packages in a tape form is then cut and separated into independent packages. It is also possible to produce modules in series. The liquid crystal polymer is low in price, is easily formed, and can be metallized. Therefore it is the most preferable material. However, there are still other suitable plastic materials.

Moreover, such a double container structure can be shaped from a ceramic material. If the ceramic is employed, sealing performance is improved.

Needles to say, a metallic package can be provided. By sintering metal materials such as Al alloy, copper, copper alloy, a double container structure can be provided. Such a metallic package is solid and has a higher reliability. However, use of any resin material enables lower cost.

Under the supposition that a package having the inside-and-outside double structure has been prepared, the following production process of Example 1 will now be described below.

First, by means of AuSn solder, the LD 30 is soldered on the Si bench (substrate) 29 on which the V-groove 39 and wiring pattern 31 for chip-mounting are formed and the Au wire 40 for conduction is strung. Then, the Si bench 29 is fixed to the bottom plate 27 of the package by mean of an epoxy-based resin.

Next, the optical fiber is inserted through the holes 32 and 33 and fixed to the V-groove 39 of the substrate 29 by an epoxy-based glue. Also, the lead frame 38 is inserted in the package and connected to the wiring pattern 31 or the electrode of the LD 30 by means of the wire 40. Then, the whole space where the LD 30 and the tip end of the optical fiber 34 exist is covered by a silicone-based transparent resin 35 until the LD is covered. Here, the inner space is surrounded by the barriers 28, the transparent resin 35 fills the inner container 26 without flowing out. By performing curing by means of heating or ultraviolet irradiation, the resin gels. The silicone-based resin includes a thermosetting silicone-based resin and an ultraviolet-curing silicone-based resin and they can be selectively used to suit the purpose. The gelation refers to moderate hardening wherein flexibility is held.

Then, the epoxy (fixing resin) resin 36 is filled in the outer walls (outer container) 25, whereby the inner container 26 and the transparent resin 35 are entirely covered. The inner space of the outer container 25 is fixed by the fixing resin 36 and the mechanical shape becomes stable. Finally, if necessary, the top plate 37 is glued. Even if the top plate 37 is not provided, a package can be formed if the outer walls 25 and the epoxy resin are made to be the same color and the upper surfaces are made into a plane.

Example 2

Optical Receiver

Figure 1:
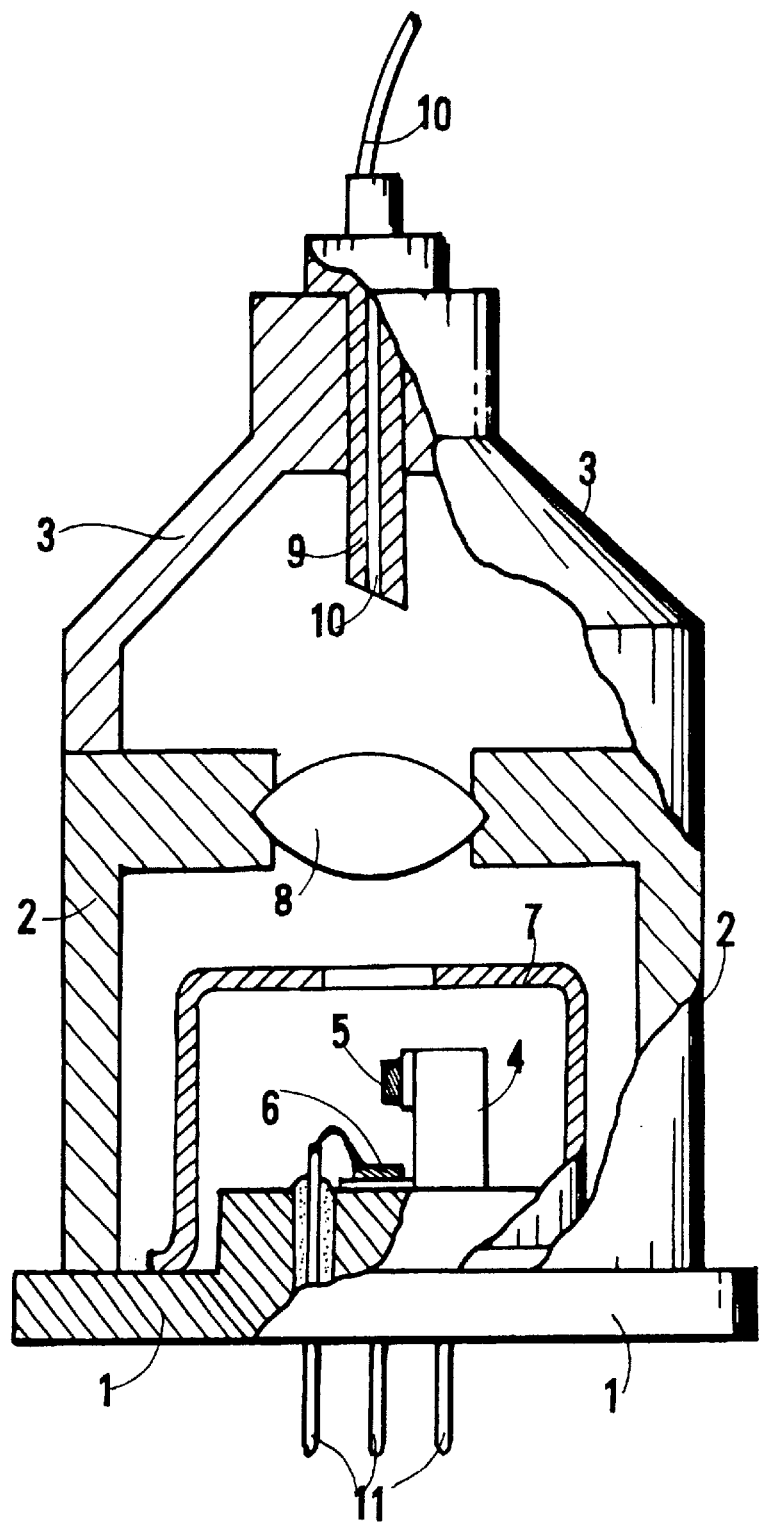
FIG. 1 is a section of an LD module according to the prior art which is accommodated in a metal package and has a three-dimensional structure.
Figure 2:
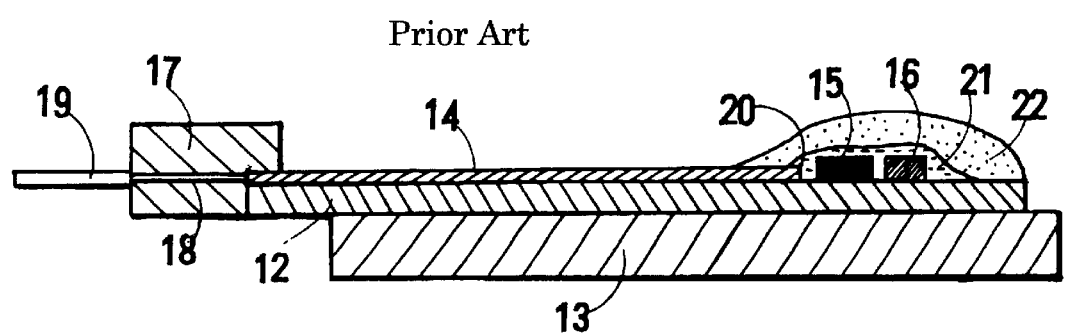
FIG. 2 is a longitudinal section of an LD module of a surface-mount type according to the prior art, wherein an optical waveguide layer is provided on the plane substrate, LD and PD chips are attached at the terminal ends of the optical waveguides, and the LD, PD, and the ends of optical waveguides are covered by a transparent resin, and an epoxy resin covers thereon.
Figure 4:
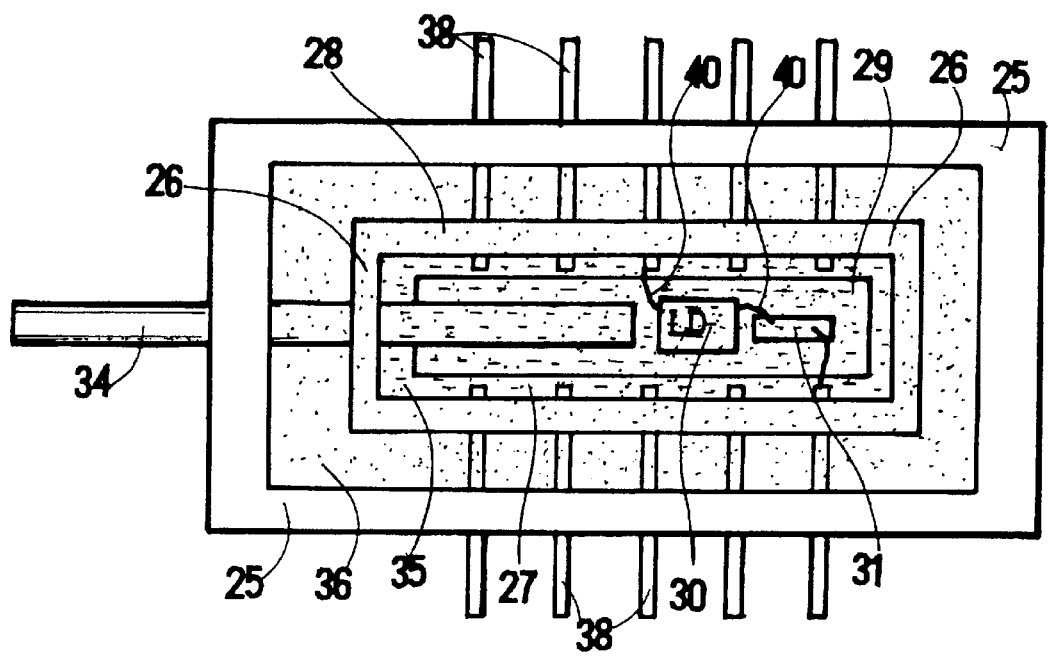
FIG. 4 is a plane view showing Example 1 having a double barrier structure and double glue structure, wherein the present invention is applied to a transmitter.

By replacing the LD by a PD in FIG. 3 and FIG. 4, a similarly structured optical receiver can be formed. In such a case, by using a PD of an edge-illuminated type, an approximately similar structure can be used without change. If a PD of a top-illuminated type is used, it may be used upright with its side surface glued to the substrate. Or by electing to use a pole (such as 4 of FIG. 1) on the substrate, the top-illuminated type PD may be fixed to the pole surface. In such a case where a pole is elected, if a PD of a rear-illuminated type is used, since the light is made incident via the rear surface of the PD-substrate, the PD is glued to the pole surface with said rear surface directed perpendicular to the direction where the light enters. Or by deepening the V-groove and utilizing the terminal end of the V-groove as an inclined mirror face, attaching the rear-illuminated type PD thereon is also possible. Thus, the light from the optical fiber is reflected by the mirror face diagonally upward so as to enter the PD.

Example 3

Optical Transmitting and Receiving Device

The present invention can be carried out in other different modes.

Figure 5:
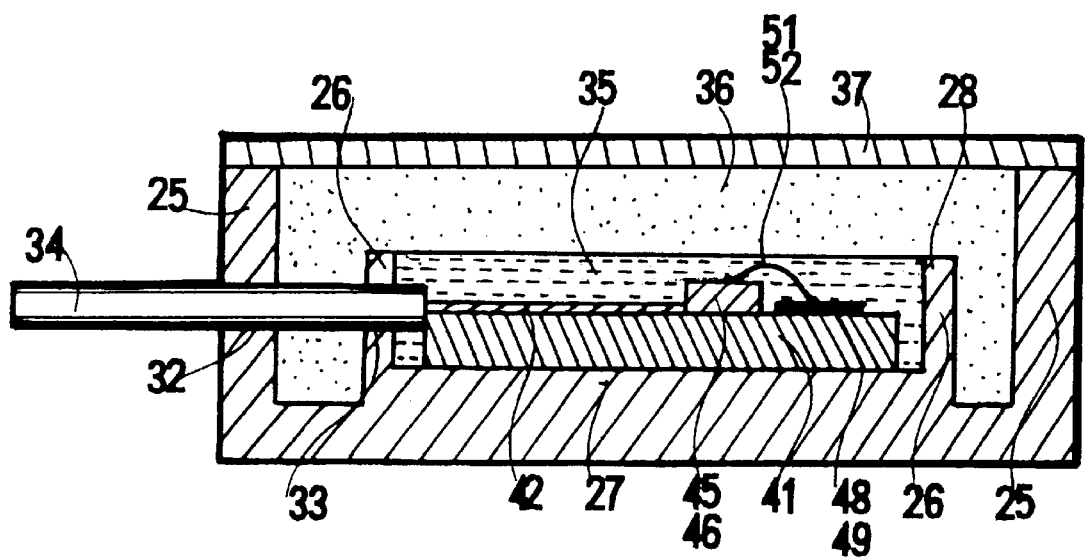
FIG. 5 is a longitudinal section showing Example 3 having a double barrier structure and double glue structure, wherein the present invention is applied to a transmitting and receiving device.
Figure 6:
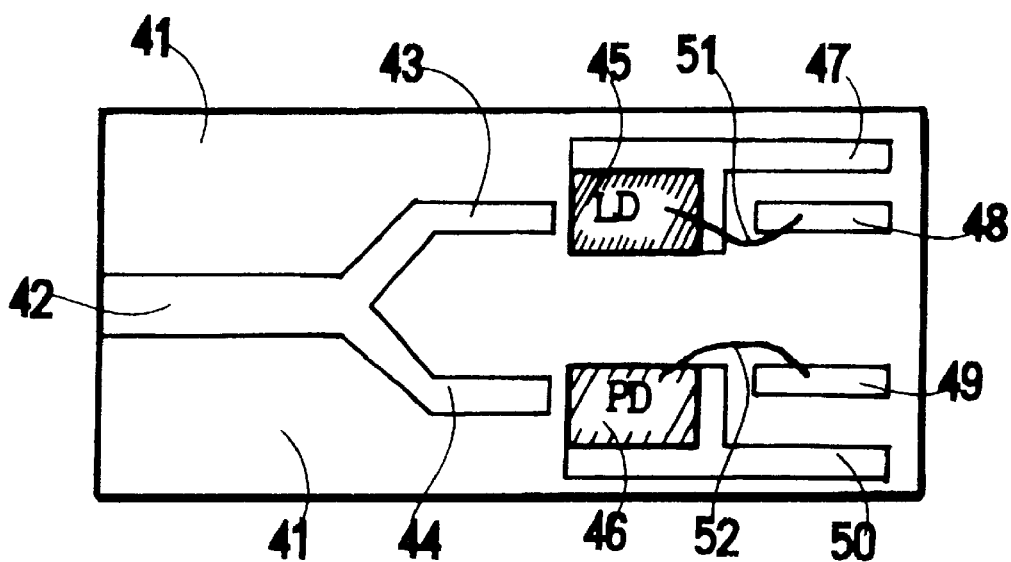
FIG. 6 is a longitudinal section showing only the substrate of Example 3 having a double barrier structure and double glue structure, wherein the present invention is applied to a transmitter.

An application example to an optical transmitting and receiving device is shown in FIG. 5 (section) and FIG. 6 (plane view of the substrate).

The present invention can be applied to a device comprising silica-based waveguides, a transmitter, and a receiver, which are provided on an Si substrate. A package which comprises the outer container 25 whose upper portion is opened and the inner container 26, and has the common bottom plate 27, is used. Similar to the above, this can be produced easily from plastic such as a liquid crystal polymer. The inner container 26 has the barriers 28 on all sides. The barriers are provided so that a fluid resin can be held. The barriers of the inner container 26 are shorter than the sidewalls of the outer container 25. The containers have the bottom plates 27 jointly and the upper portions of both containers are opened.

A substrate 41 is accommodated in the inner container 26. FIG. 6 shows a plane view of the substrate 41. Branched optical waveguides 42, 43, and 44 are formed on the substrate 41. Herein, light is not simply branched into two waveguides. The branch has wavelength selectivity and selects light $\lambda_1$ from the LD and light $\lambda_2$ to the PD. That is, the branched optical waveguides are formed so that the WDM function can be provided.

Metallized patterns 47 and 50 are provided ahead of the branched waveguides 43 and 44, and an LD 45 and a PD 46 are fixed thereon. The metallized patterns 47 and 48 are patterns for the LD 45, and the metallized patterns 49 and 50 are patterns for the PD 46. The LD 45 is fixed on the pattern 47. The electrode on the upper surface of the LD 45 is connected to the wiring pattern 48 by means of a wire 51. The PD 46 is fixed on the pattern 50. The electrode on the upper surface of the PD 46 is connected to the wiring pattern 49 by means of a wire 52.

On the front end walls of the outer container 25 and inner container 26, the horizontal holes 32 and 33 are bored. The optical fiber 34 is inserted through the holes 32 and 33 and fixed to the end face of the substrate 41 by an epoxy-based glue. The optical fiber 34 is optically connected to the optical waveguide 42. Then, the whole space where the LD 45, the PD 46, the optical waveguides 42, 43, and 44, the substrate 41, and the tip end of the optical fiber 34 exist, is covered by the silicone-based transparent resin 35. Herein, since the inner space is surrounded by the barriers 28, the transparent resin 35 does not flow out from the inner container 26. By performing curing by means of heating or ultraviolet irradiation, the resin gels.

Then, the epoxy (fixing resin) resin 36 is filled inside the outer walls (outer container) 25, whereby the inner container 26 and the transparent resin 35 are entirely covered. The inner space of the outer container 25 is fixed by the fixing resin 36. Finally, if necessary, the top plate 37 is glued. Even if the top plate 37 is not provided, a package can be formed if the outer walls 25 and the epoxy resin are made to be the same color and the upper surfaces are made into a plane.

Example 4

Optical Multiplexer, Optical Demultiplexer

The present invention can also be applied to an optical multiplexer and an optical demultiplexer. Herein, one optical fiber is united with two optical fibers. When light is only split, it is sufficient that the Y-branched waveguides are formed on the substrate. Then the optical fibers are connected to the end portions of the waveguides on the substrate. In the case of an optical multiplexer and an optical demultiplexer having wavelength selectivity, the WDM function is provided for the branched portion of the Y-branched waveguides to distribute light selectively.

Figure 7:
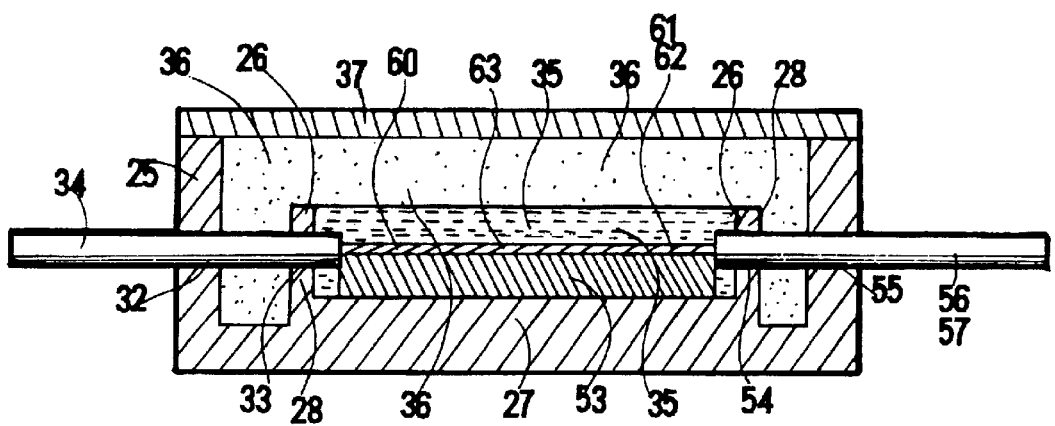
FIG. 7 is a longitudinal section showing Example 4 having a double barrier structure and double glue structure, wherein the present invention is applied to an optical multiplexer and an optical demultiplexer.
Figure 8:
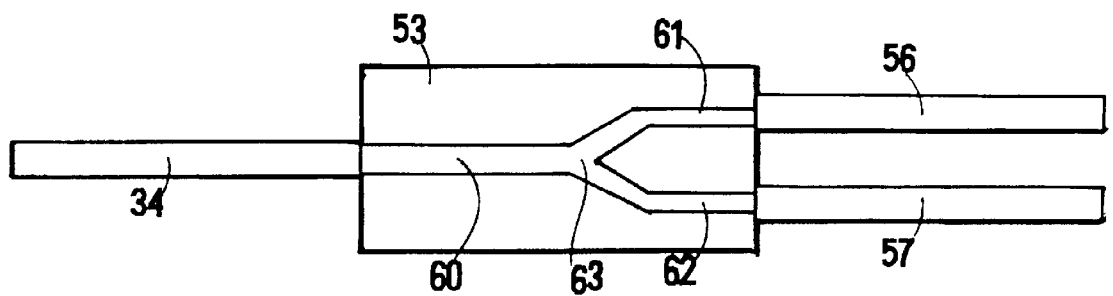
FIG. 8 is a longitudinal section showing only the substrate of Example 4 having a double barrier structure and double glue structure, wherein the present invention is applied to an optical multiplexer and an optical demultiplexer.

An application example of an optical multiplexer and an optical demultiplexer is shown in FIG. 7(section) and FIG. 8 (plane view of the substrate). A package which comprises the outer container 25 whose upper portion is opened and the inner container 26, and has the common bottom plate 27 is used. The inner container 26 has the barriers 28 on all sides. The barriers of the inner container 26 are shorter than the sidewalls of the outer container.

A substrate 53 is accommodated in the inner container 26. FIG. 8 shows a plane view of the substrate 53. Branched optical waveguides 60, 61, and 62 are formed on the substrate 53. There may be a case where an optical branch 63 simply branches light into two waveguides. Also, the branch has wavelength selectivity and it is also possible to pass light $\lambda_1$ and light $\lambda_2$ selectively. The optical fiber 34 is glued to the tip end of the waveguide 60 on the substrate 53. An optical fiber 56 is glued to the terminal end portion of the waveguide 61 and an optical fiber 57 is glued to the terminal end portion of the waveguide 62.

In one case where the device is used as an optical demultiplexer, the light from the optical fiber 34 is guided to the optical waveguide 60 and split into two beams of light and they are distributed to the optical waveguides 61 and 62 and to the optical fibers 56 and 57. In this case, when the optical demultiplexer is used as a simple beam optical splitter without wavelength selectivity, the optical branch 63 is a simple branch.

In the other case where the device is used as an optical multiplexer, the light from the optical fibers 56 and 57 is combined in the optical branch 63 and the multiplexed light exits from the optical fiber 34.

In addition, similar to FIG. 6, there is a case where the LD and PD are coupled with the terminal ends of optical fibers 56 and 57. In such a case, the operation wavelength ($\lambda_1$ and $\lambda_2$) is different from the LD to the PD. In this case, the optical branch is not a simple branch. The optical branch 63 has wavelength selectivity and selects the light $\lambda_1$ from the LD and light $\lambda_2$ to the PD. That is, the branch is formed so that the WDM function is provided.

The substrate 53 having a Y-branched optical waveguide structure as shown in FIG. 8 is fixed inside the inner container 26 and the optical fibers 34, 56, and 57 are inserted through the holes on the wall surfaces of the inner container 26 and fixedly attached to the end faces of the substrate. The transparent resin 35 is filled in the inner container 26. This resin is half-hardened into a gel form by means of ultraviolet ray or heat. Further thereon, the epoxy fixing resin 36 is filled and hardened. Further thereon, if necessary, the top plate 37 is placed so that the package is sealed.

Example 5

A Case where a Lens is Interposed

Figure 9:
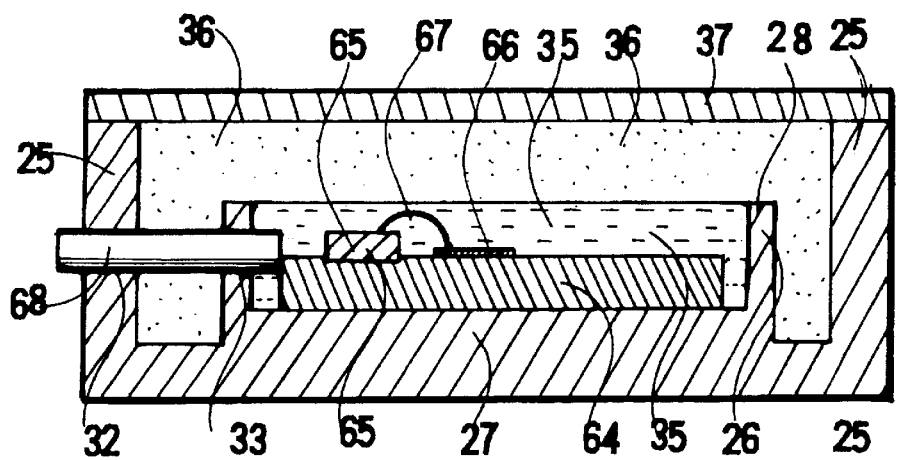
FIG. 9 is a longitudinal section showing Example 5, wherein the present invention is applied to an LD and PD module with a lens.

In addition to a structure wherein optical fibers and ferrules are inserted in the outer container and inner container, a structure can be employed wherein a lens is inserted and fixed in the outer container and inner container. The structure will now be described with reference to FIG. 9. When a rod lens is used as the lens, it can be inserted into the container walls. This structure can be applied to any of a transmitter, a receiver, a transmitting and a receiving device, and an optical branching element.

Except for the aspect wherein the optical fibers are replaced by the lens, this structure is the same as that described hereinbefore. The outer container 25 whose upper portion is opened and the inner container 26 formed in the outer container have the bottom plates 27 jointly. The inner container 26 has the barriers 28 to hold the fluid resin. The barriers of the inner container 26 are shorter than the sidewalls of the outer container 25. The substrate 64 is accommodated in the inner container 26.

Similar to Example 1, a case where this structure is applied to a transmitter will now be described. An LD 65 is fixed on the substrate 64. A wiring pattern 66 has been printed in advance, and the electrode of the LD 65 and the wiring pattern 66 are connected by means of a wire 67. Such a structure is the same as that of Example 1.

horizontal holes 32 and 33 are bored on the front end walls of the outer container 25 and inner container 26. A rod lens 68 is inserted in these holes. The LD 65 is positioned on the tip end of the lens. An optical fiber (not illustrated) is connected to the outer end of the lens. The lens condenses the light from the LD and transmits the light to the external fiber.

The transparent resin 35 is filled in the inner container 26. The end of the lens, the LD 65, the wiring pattern 66, the wire 67, and the substrate 64, etc. are completely covered by the transparent resin 35. The fixing resin 36 is filled over the inner container and outside the inner container.

What is claimed is:

1. An optical module comprising:

an inner container having a plurality of barriers;

optical devices within the inner container for exchanging optical signals;

a first resin that completely fills in the inner container; and a second resin that surrounds the inner container.

2. An optical module as set forth in claim 1, wherein the first resin is a transparent resin which is transparent in terms of light to be exchanged by the optical elements.

3. An optical module as set forth in claim 1 or 2, wherein an outer container surrounds at least a part of the second resin.

4. An optical module as set forth in claim 1 or 2, wherein the second resin is not transparent.

5. An optical module as set forth in claim 1 or 2, wherein the optical devices are provided on a flat substrate, the substrate is accommodated in the inner container, the inner container containing the substrate is covered by the first resin.

6. An optical module as set forth in claim 1 or 2, wherein the module further includes an optical element for optical transmission which exchanges light with respect to the outside and wherein the optical devices provide for at least one of light emission, light receiving, optical demultiplexing, and optical multiplexing.

7. An optical module as set forth in claim 6, wherein the optical element for optical transmission is an optical fiber.

8. An optical module as set forth in claim 5, wherein the substrate is an Si bench and the optical devices are mounted on the Si bench.

9. An optical module as set forth in claim 8, wherein a silica-based waveguide structure is provided on the Si bench, an optical fiber is connected to the end portion of the waveguide, and the functional optical devices are mounted on the silica-based waveguide structure.

10. An optical module as set forth in claim 1 or 2, wherein the inner container and outer container have a common part and construct a package having an integrated structure.

11. An optical module comprising:

an optical waveguide formed on an Si substrate;

an optical fiber fixed to a part of the optical waveguide;

a light emitting device or a light receiving device;

a transparent resin for covering the gaps between the optical fiber and the light emitting device or light receiving device and the optical waveguide;

an inner container having a structure of barriers which surround the transparent resin;

a fixing resin covering the optical waveguide, the optical fiber, the light emitting device or light receiving device, the transparent resin, and the inner container; and an outer container for protecting the fixing resin and contents thereof.

* * * * *